US009143102B2

(12) United States Patent
Shimomaki

(10) Patent No.: US 9,143,102 B2
(45) Date of Patent: Sep. 22, 2015

(54) OPERATIONAL AMPLIFYING CIRCUIT AND LIQUID CRYSTAL PANEL DRIVE DEVICE USING THE SAME

(75) Inventor: Kenji Shimomaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 875 days.

(21) Appl. No.: 13/305,159

(22) Filed: Nov. 28, 2011

(65) Prior Publication Data

US 2012/0133688 A1 May 31, 2012

(30) Foreign Application Priority Data

Nov. 29, 2010 (JP) ................................. 2010-265046
Sep. 30, 2011 (JP) ................................. 2011-217040

(51) Int. Cl.
*G09G 3/36* (2006.01)
*G09G 5/00* (2006.01)
*G06F 3/038* (2013.01)
*H03F 3/45* (2006.01)

(52) U.S. Cl.
CPC .......... *H03F 3/45219* (2013.01); *G09G 3/3688* (2013.01); *G09G 2310/0291* (2013.01); *G09G 2310/08* (2013.01); *H03F 2203/45248* (2013.01); *H03F 2203/45461* (2013.01)

(58) Field of Classification Search
None
See application file for complete search history.

(56) References Cited

U.S. PATENT DOCUMENTS

| 7,652,538 | B2 | 1/2010 | Choi | |
| 7,863,982 | B2 * | 1/2011 | Chen et al. | 330/261 |
| 7,907,011 | B2 * | 3/2011 | Chung | 330/255 |
| 8,044,950 | B2 | 10/2011 | Satou | |
| 8,184,083 | B2 * | 5/2012 | Chung | 345/98 |
| 2003/0160749 | A1 * | 8/2003 | Tsuchi | 345/87 |
| 2010/0033250 | A1 * | 2/2010 | Shimatani | 330/253 |

FOREIGN PATENT DOCUMENTS

| JP | 2006-94534 A | 4/2006 |
| JP | 2006-119364 A | 5/2006 |
| JP | 2007-149207 A | 6/2007 |
| JP | 2007-208316 A | 8/2007 |
| JP | 2008-211623 A | 9/2008 |

* cited by examiner

*Primary Examiner* — Seokyun Moon
(74) *Attorney, Agent, or Firm* — Foley & Lardner LLP

(57) ABSTRACT

An operational amplifier circuit includes: a first differential amplifier section containing a P-type differential pair of P-type transistors; a second differential amplifier section containing an N-type differential pair of N-type transistors; an intermediate stage connected with outputs of the first and second differential amplifier sections and containing a first current mirror circuit of P-type transistors, and a second current mirror circuit of N-type transistors; and an output stage configured to amplify an output of the intermediate stage in power. The first differential amplifier section includes a first current source and a first capacitance between sources of the P-type transistors of the P-type differential pair and a positive side power supply voltage. The second differential amplifier section includes a second current source and a second capacitance between sources of the N-type transistors of the N-type differential pair and a negative side power supply voltage.

10 Claims, 4 Drawing Sheets

OPERATIONAL AMPLIFYING CIRCUIT AND LIQUID CRYSTAL PANEL DRIVE DEVICE USING THE SAME

CROSS-REFERENCE

This patent application claims priorities on convention based on Japanese Patent Application No. JP2010-265046 and JP2011-217040. The disclosures thereof are incorporated herein by reference.

TECHNICAL FIELD

The present invention is related to an operational amplifier circuit, and particularly an operational amplifier circuit used for a liquid crystal panel drive device.

BACKGROUND ART

In recent years, products using a liquid crystal panel such as a television receiver, a mobile phone, and a handheld terminal are increasing. Also, the demand of the large-sized thin flat panel is increasing. In a semiconductor integrated circuit for controlling the display of the liquid crystal panel, a high-speed operation is required to realize double speed drive to reduce a residual image in the display of an image and to allow smooth change of the image, in addition to realization of a 3D (3-dimensional) image.

A technique of an operational amplifier to improve a slew rate is disclosed in Patent Literature (JP 2006-094534A). The operational amplifier is provided with a first supply voltage rail section, a second supply voltage rail section, an input stage, a folded cascade connection stage, an output driver stage and a compensation circuit. The input stage includes a first input terminal and a second input terminal. The folded cascade connection stage is provided with first to fourth nodes and is connected to an output of the input stage. The output driver stage is provided with first and second output transistors which are respectively connected to the first and second nodes of the folded cascade stage, and outputs a drive current to an output node of the operational amplifier. The compensation circuit is provided with first and second capacitors, and first to fourth switches and is connected to the third and fourth nodes of the folded cascade connection stage and the output node of the operational amplifier. The output node is connected to the second input terminal of the input stage. The first switch and the first capacitor are connected in series between the first supply voltage rail section and the output node. The second switch and the second capacitor are connected in series between the second supply voltage rail section and the output node. The third switch is connected to the third node of the folded cascade connection stage between the first switch and the first capacitor. The fourth switch is connected to the fourth node of the folded cascade connection stage between the second switch and the second capacitor. Moreover, the compensation circuit is provided with the third capacitor between the third node of the folded cascade connection stage and the output node, and is provided with the fourth capacitor between the fourth node of the folded cascade connection stage and the output node.

In this way, the above-mentioned operational amplifier has phase compensation capacitors which are connected in parallel to improve a slew rate. In the section in which the output voltage changes, only the one of the phase compensation capacitors connected in parallel is used. Therefore, there is a fear that the amplification operation becomes instable.

CITATION LIST

[Patent Literature 1]: JP 2006-094534A

SUMMARY OF THE INVENTION

The present invention provides an operational amplifier circuit, and a liquid crystal panel drive device using the same, which improves a slew rate while operating stably.

In an aspect of the present invention, an operational amplifier circuit includes: a first differential amplifier section containing a P-type differential pair of P-type transistors; a second differential amplifier section containing an N-type differential pair of N-type transistors; an intermediate stage connected with outputs of the first and second differential amplifier sections and containing a first current mirror circuit of P-type transistors, and a second current mirror circuit of N-type transistors; and an output stage configured to amplify an output of the intermediate stage in power. The first differential amplifier section includes a first current source and a first capacitance between sources of the P-type transistors of the P-type differential pair and a positive side power supply voltage. The second differential amplifier section includes a second current source and a second capacitance between sources of the N-type transistors of the N-type differential pair and a negative side power supply voltage.

In another aspect of the present invention, the liquid crystal driver circuit is provided with a buffer circuit in which the above operational amplifier circuit is connected to configure a voltage follower; and a gray-scale voltage generating circuit configured to generate a gray-scale voltage based on an input signal to output to said buffer circuit.

According to the present invention, the operational amplifier circuit and the liquid crystal panel drive device using the same are provided to improve a slew rate while operating stably.

DESCRIPTION OF EMBODIMENTS

Hereinafter, a liquid crystal display which uses a liquid crystal drive device using an operational amplifier circuit according to the present invention will be described with reference to the drawings.

Figure 1:
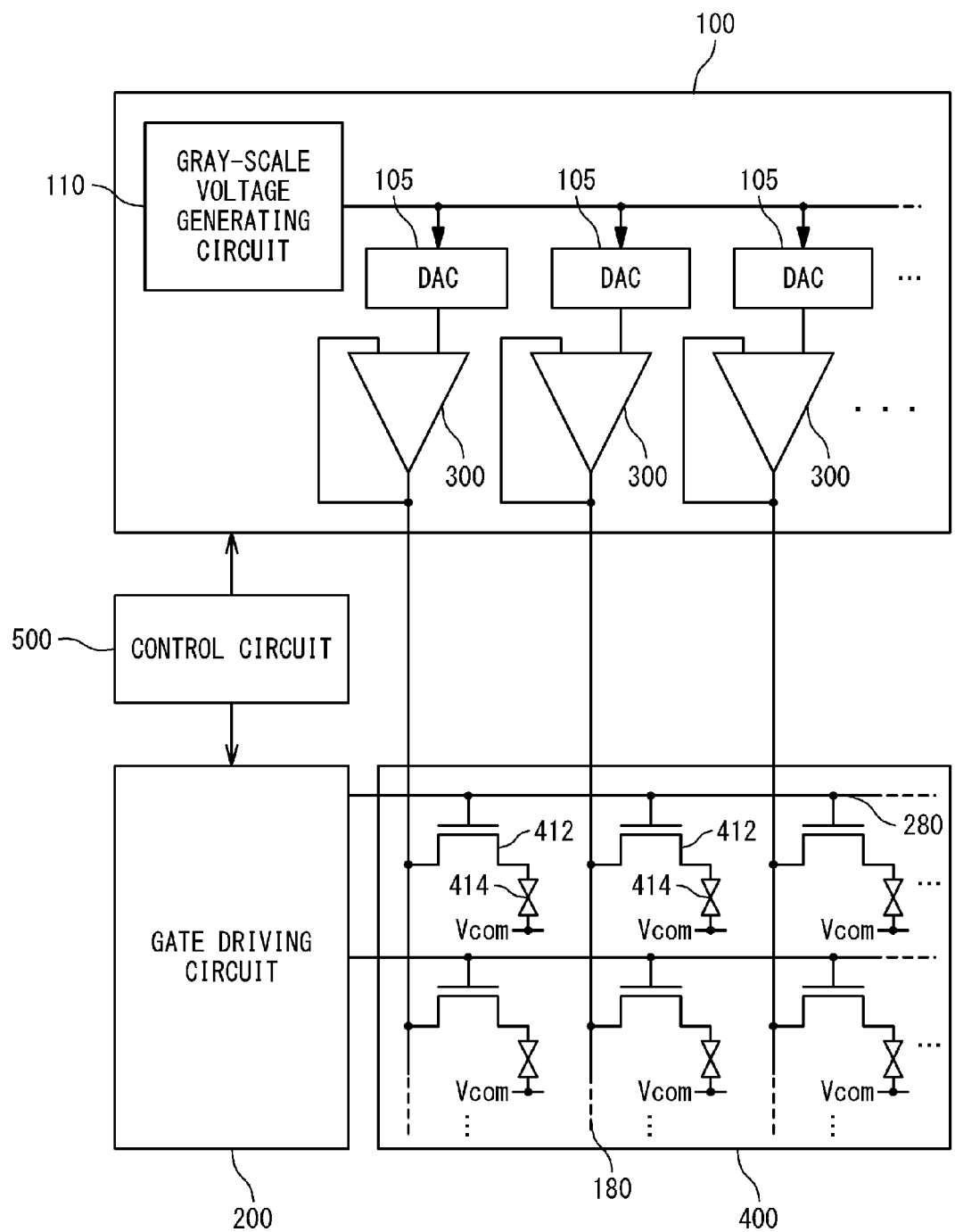
FIG. 1 is a diagram schematically showing a configuration of a liquid crystal display according to an embodiment of the present invention.

FIG. 1 is a diagram schematically showing the configuration of the liquid crystal display according to an embodiment of the present invention. The liquid crystal display is provided with a source drive circuit (a source driver) 100, a gate drive circuit (a gate driver) 200, a display panel 400 and a control circuit 500. The control circuit 500 controls the operation timings of the source drive circuit 100 and the gate drive circuit 200 based on a signal supplied externally. The display panel 400 is provided with TFTs (Thin Film Transistors) 412 and liquid crystal capacitances 414, which are arranged in a matrix. The source drive circuit 100 drives a data line 180 connected with the TFTs 412 in a column direction of the display panel 400. The gate drive circuit 200 drives a scanning line 280 connected with the TFTs 412 in a row direction of the display panel 400. The source drive circuit 100 is provided with a gray-scale voltage generating circuit 110, D/A conversion circuits (DACs) 105 and buffer circuits, each of which contains an operational amplifier circuit 300. The D/A conversion circuit 105 carries out a D/A conversion based on a gray-scale voltage which is generated by a gray-scale voltage generating circuit 110. Power is amplified by the buffer circuit (the operational amplifier circuit 300 has a voltage follower connection) and a signal subjected to the D/A conversion is supplied to the data line 180.

Figure 2:
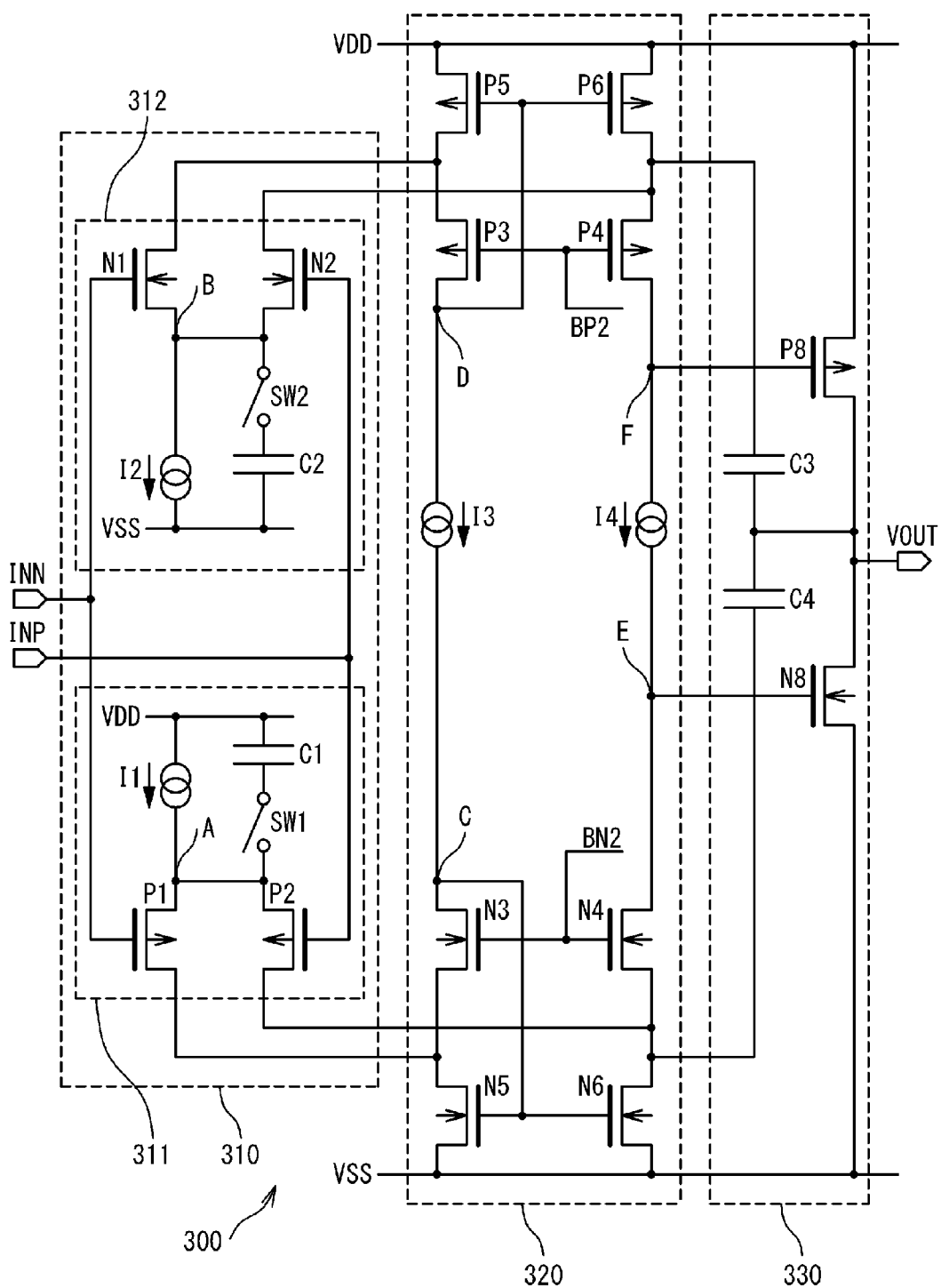
FIG. 2 is a diagram showing the configuration of an operational amplifier circuit according to the embodiment of the present invention.

The operational amplifier circuit 300 is a Rail-to-Rail folded cascade connected differential amplifying circuit which is provided with a differential stage 310, an intermediate stage 320, and an output stage 330, as shown in FIG. 2.

The differential stage 310 is provided with a differential amplifier 311 which contains P-type transistors and a differential amplifier 312 which contains N-type transistors. The differential amplifier 311 is provided with P-type transistors P1 and P2 for a differential pair, a constant current source I1, a capacitance C1 and a switch SW1. The capacitance C1 and the switch SW1 are connected in series between sources (node A) of the P-type transistors P1 and P2 connected in common and a positive side power supply voltage VDD, and the constant current source I1 is connected in parallel to the series connection of the capacitance C1 and the switch SW1. The differential amplifier 312 is provided with the N-type transistors N1 and N2 for a differential pair, a constant current source I2, a capacitance C2 and a switch SW2. The capacitance C2 and the switch SW2 are connected in series between sources (node B) of the N-type transistors N1 and N2 connected in common and a negative side power supply voltage VSS, and the constant current source I2 is connected in parallel to the series connection of the capacitance C2 and the switch SW2.

The gate of the P-type transistor P1 and the gate of the N-type transistor N1 are connected with an inversion input node INN. The gate of the P-type transistor P2 and the gate of the N-type transistor N2 are connected with a non-inversion input node INP. The switches SW1 and SW2 carry out a switching operation in response to a control signal outputted from the control circuit 500.

The intermediate stage 320 is provided with a current mirror circuit which contains P-type transistors P3 to P6, a current mirror circuit which contains N-type transistors N3 to N6, and constant current sources I3 and I4. The P-type transistor P3 to P6 forms a current mirror circuit. The P-type transistors P5 and P3 are connected in series between the positive side power supply voltage VDD and the constant current source I3, and the P-type transistors P6 and P4 are connected in series between the positive side power supply voltage VDD and the constant current source I4. The gate of the P-type transistor P3 and the gate of the P-type transistor P4 are connected and a bias voltage BP2 is applied thereto. The gate of the P-type transistor P5 and the gate of the P-type transistor P6 are connected with a connection node D between the drain of the P-type transistor P3 and the constant current source I3. A connection node F between the drain of the P-type transistor P4 and the constant current source I4 is connected with the gate of output transistor P8. The drain of the N-type transistor N1 of the differential amplifier 312 is connected with a connection node between the drain of the P-type transistor P5 and the source of the P-type transistor P3.

The drain of the N-type transistor N2 of the differential amplifier 312 is connected with a connection node between the drain of the P-type transistor P6 and the source of the P-type transistor P4.

The N-type transistors N3 to N6 form a current mirror circuit. The N-type transistors N5 and N3 are connected in series between the negative side power supply voltage VSS and the constant current source I3, and the N-type transistors N6 and N4 are connected in series between the negative side power supply voltage VSS and the constant current source I4. The gate of the N-type transistor N3 and the gate of the N-type transistor N4 are connected and a bias voltage BN2 is applied thereto. The gate of the N-type transistor N5 and the gate of the N-type transistor N6 are connected a connection node C between the drain of the N-type transistor N3 and the constant current source I3. A connection node E between the drain of the N-type transistor N4 and the constant current source I4 is connected with the gate of the output transistor N8. The drain of the P-type transistor P1 of the differential amplifier 311 is connected with a connection node between the drain of the N-type transistor N5 and the source of the N-type transistor N3. The drain of the P-type transistor P2 of the differential amplifier 311 is connected with a connection node between the drain of the N-type transistor N6 and the source of the N-type transistor N4. The constant current origin I3 is provided between the node D and the node C as a floating current source. The constant current source I4 is provided between the node F and the node E as a floating current source.

The output stage 330 is provided with output transistors P8 and N8 and phase compensation capacitances C3 and C4. The output transistors P8 and N8 are connected in series between the positive side power supply voltage VDD and the negative side power supply voltage VSS. A connection node between the drain of output transistor P8 and the drain of output transistor N8 functions as an output node VOUT.

The phase compensation capacitance C3 is connected between the connection node of the drain of the P-type transistor P6 and the source of the P-type transistor P4 and the output node VOUT. The phase compensation capacitance C4 is connected between the connection node of the drain of the N-type transistor N6 and the source of the N-type transistor N4 and the output node VOUT.

Figure 3:
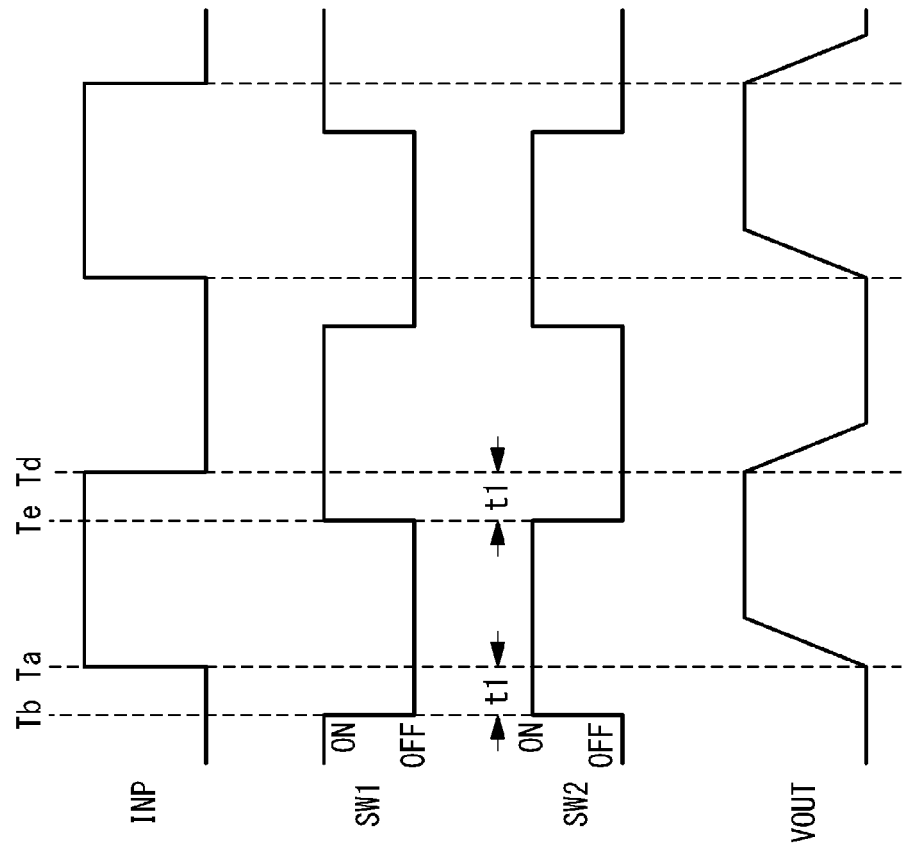
FIG. 3A to FIG. 3D show timing charts an operation of the operational amplifier circuit according to the embodiment of the present invention.

Moreover, referring to FIG. 3, an operation of the operational amplifier circuit 300 according to the present embodiment will be described.

The output node VOUT is connected with the inversion input node INN. That is, the operational amplifier circuit 300t will be described as a voltage follower. Also, as shown in FIG. 3A, the description will be given under a condition that a signal rising from the VSS is supplied to the non-inversion input node INP of the operational amplifier circuit 300 at time Ta as an input voltage. At this time, the differential amplifier 312 switches from an OFF state to an ON state. Contrary to this, the differential amplifier 311 which is provided with the P-type transistors switches from the ON state to the OFF state as the voltage of the signal applied to the non-inversion input node INP becomes high.

At time Tb by a time period t1 before the time Ta at which the signal applied to the non-inversion input node INP rises, the control circuit 500 outputs a control signal to close the switch SW2 of the differential amplifier 312 (FIG. 3C). Moreover, when the switch SW2 is closed, the node B is connected with the negative side power supply voltage VSS through the capacitance C2. That is, the sources (node B) of the N-type transistors N1 and N2 which are connected in common are connected with the negative side power supply voltage VSS through the constant current source I2 which is connected in parallel to the capacitance C2. At this time, because the signal applied to the non-inversion input node INP is still a low voltage, the differential amplifier 312 is in an OFF state and the node B has a voltage in the neighborhood of the negative side power supply voltage VSS. Therefore, the charge of the capacitance C2 is discharged through the constant current source I2 from the node B. The time period t1 is a period to discharge from the capacitances C1 and C2. When the time period t1 is too short, the discharging becomes insufficient and the effect of the present invention is insufficient. When the time period t1 is too long, an influence appears on the signal waveform. When being applied to a drive circuit of a display unit, it sometimes causes the degradation of the image quality. It is desirable that the time period t1 is a necessary and minimum time to discharge.

After that, when the voltage of the non-inversion input node INP rises at the time Ta, the differential amplifier 312 begins to operate and the electric charge stored in the phase compensation capacitance C3 flows into the capacitance C2. Therefore, a current which flows through the node B of the differential amplifier 312 is more than a current which flows through the constant current source I2. When supposing that a capacitance value of the phase compensation capacitance is C3 and a current which flows through the node B of the differential amplifier 312 is I, a slew rate (=SR) is calculated from SR=I/C. Therefore, when the switch SW2 is closed so that the current I which flows through the node B increases, the slew rate is improved (FIG. 3D).

When the signal applied to the non-inversion input node INP falls from the VDD to the VSS, the operations of the P-type transistor and the N-type transistor are exchanged. That is, the differential amplifier 312 is switched from the ON state to the OFF state and the differential amplifier 311 is switched from the OFF state to the ON state.

At time Te by the time period t1 before time Td which the signal applied to the non-inversion input node INP falls, the control circuit 500 outputs a control signal to close the switch SW1 of the differential amplifier 311 (FIG. 3B). Moreover, when the switch SW1 is closed, the node A is connected with the positive side power supply voltage VDD through the capacitance C1. That is, the sources (node A) of the P-type transistors P1 and P2 which are connected in common are connected with the positive side power supply voltage VDD through the constant current source I1 and the capacitance C1 which are connected in parallel. At this time, because the signal applied to the non-inversion input node INP is still high voltage, the differential amplifier 311 is in an OFF state and the node A is in a voltage in the neighborhood of the positive side power supply voltage VDD. Therefore, the electric stored in the capacitance C1 is discharged through the constant current source I1 from the node A.

After that, when the voltage of the non-inversion input node INP falls at time Td, the differential amplifier 311 begins to operate and the charge stored in the phase compensation capacitance C4 flows into the capacitance C1. Therefore, a current which flows through the node A of the differential amplifier 311 is more than a current which flows through the constant current source I1. Therefore, when the switch SW1 is closed so that the current I which flows through the node A increases, the slew rate (SR=I/C) is improved (FIG. 3D).

In this way, because the phase compensation capacitances C3 and C4 are fixed and operated, the operational amplifier circuit 300 operates in a stable condition and the slew rate can be improved. Generally, the amplifier circuit operates stably when the capacitance value of the phase compensation capacitance is large. However, the slew rate SR reduces as the capacitance value C of the phase compensation capacitance increases because the slew rate SR is determined from SR=I/C. In the present invention, the capacitances C1 and C2 and the switches SW1 and SW2 are provided in parallel with the constant current sources I1 and I2 in the differential stage 310, respectively. The switches SW1 and SW2 are controlled by the control circuit 500 to increase current temporarily, which improves the slew rate. Therefore, the operational amplifier circuit 300 operates stably and the slew rate can be improved.

Figure 4:
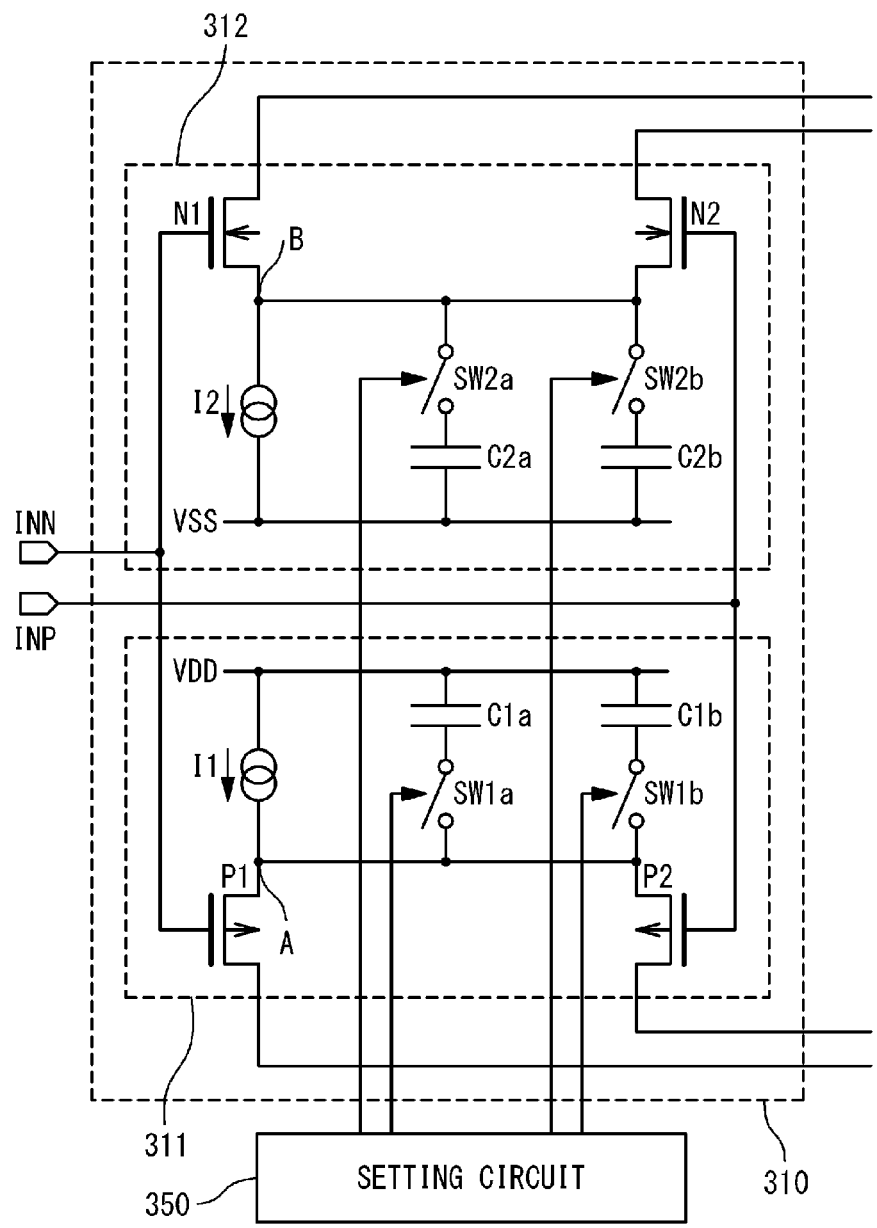
FIG. 4 is a diagram showing the configuration of the operational amplifier circuit according to another embodiment of the present invention.

As shown in FIG. 4, each of the capacitance C1 and the capacitance C2 may be divided into a plurality of capacitances and be controlled. In this example, the capacitance C1 is divided into capacitances C1a and C1b, and switches SW1a and SW1b are connected in series with them, respectively. Also, the capacitance C2 is divided into capacitance C2a and C2b and switches SW2a and SW2b are connected in series with them, respectively. Therefore, the capacitance value of the capacitance C1 can be shown as a synthetic capacitance value of the capacitances C1a and C1b and the capacitance value with capacitance C2 can be shown as a synthetic capacitance value of capacitances C2a and C2b. That is, by the controlling the switches SW1a, SW1b, SW2a, and SW2b, the capacitance values of capacitances C1 and C2 can be changed. It is possible to adjust the slew rate to be suitable for the specification, because the slew rate can be changed by use of the capacitance values of the capacitances C1 and C2.

That is, a setting circuit 350 holds data indicating which capacitances of the plurality of capacitances C1a, C1b, C2a, and C2b are used, that is, indicating the closed switches and the opened switches among the switches SW1a, SW1b, SW2a, and SW2b. This data may be held by a register and may be substantially fixedly held by fuses. The data may be written in a non-volatile memory such as a flash memory, or the data may be written in a memory when the memory is installed in an apparatus. If the register is the non-volatile memory as the register, the data can be written immediately before an operation start.

In case of a display drive circuit using many operational amplifier circuits, about 1000 operational amplifier circuits are provided. For this reason, even if the slew rates of operational amplifier circuits are varied, the slew rates can be adjusted. Also, there is a case that the signal waveform becomes dull, depending on a position in which the drive circuit is arranged. In such a case, it is possible to change the slew rate depending on the position so as to decrease a deviation of the waveform of the output signal.

As described above, the embodiments of the present invention have been described but the present invention is not limited to the embodiments. Various modifications may be carried out within the scope of the present invention.

What is claimed is:

1. An operational amplifier circuit comprising:
a first differential amplifier section comprising a P-type differential pair of P-type transistors;
a second differential amplifier section comprising an N-type differential pair of N-type transistors;
an intermediate stage connected with outputs of said first and second differential amplifier sections and comprising a first current mirror circuit of P-type transistors, and a second current mirror circuit of N-type transistors; and
an output stage configured to amplify a power of an output of said intermediate stage, wherein said first differential amplifier section comprises a first current source and a first capacitor between sources of said P-type transistors of said P-type differential pair and a positive side power supply voltage, and wherein said second differential amplifier section comprises a second current source and a second capacitor between sources of said N-type transistors of said N-type differential pair and a negative side power supply voltage.

2. The operational amplifier circuit according to claim 1, further comprising:
a first switch provided between the sources of said P-type transistors of said P-type differential pair and said first capacitor; and
a second switch provided between the sources of said N-type transistors of said N-type differential pair and said second capacitor,
wherein said first switch and said second switch are alternately opened or closed in synchronization with an input differential signal supplied to said first differential amplifier and said second differential amplifier.

3. The operational amplifier circuit according to claim 2, wherein said first switch and said second switch from an open state to a close state by respective predetermined time before the switching of said input differential signal.

4. The operational amplifier circuit according to claim 1, wherein said intermediate stage comprises a floating current source, and comprises a Rail-to-Rail folded cascade-type amplifying circuit configured to convert an output current signal from said first differential amplifier and said second differential amplifier into a voltage signal, to output to said output stage.

5. The operational amplifier circuit according to claim 2, wherein said first capacitor is divided into a plurality of first division capacitors, and said second capacitor is divided into a plurality of second division capacitors.
wherein said operational amplifier circuit comprises:
a plurality of first division switches provided between the sources of said P-type transistors of said the P-type the differential pair and of said plurality of first division capacitors respectively;
a plurality of second division switches provided between the sources of said N-type transistors of said the N-type differential pair and of said plurality of second division capacitors, respectively;
a setting circuit configured to control the open state and the close state of said plurality of first division switches and said plurality of second division switches,
wherein said setting circuit alternately sets a specific first division switch of said plurality of first division switches and a specification specific second division switch of said plurality of second division switches to the open state and the close state in synchronization with said input differential signal.

6. The operational amplifier circuit according to claim 5, wherein said setting circuit comprises:
a memory element configured to store an identification of said specific first division switch and said specific second division switch, and switch the open state and the close state of said specific first division switch and said specific second division switch based on a setting condition of said memory element before the switching of said input differential signal by a predetermined time, and open switches of said plurality of first division switches other than said specific first division switch and switches of said plurality of second division switches other than said specific second division switch.

7. The operational amplifier circuit according to claim 5, wherein capacitance values of said plurality of first division capacitors are different from each other, and capacitance values of said plurality of second division capacitors are different from each other.

8. An operational amplifier circuit comprising:
first and second P-type transistors of a P-t e differential pair;
first constant current source connected between sources of said first and second P-type transistors which are connected in common, and a positive side power supply voltage;
a series connection of a first capacitor and a first switch which is in parallel to said first constant current source;
first and second N-type transistors of an N-type differential pair, wherein gates of said first P-type transistor and said first N-type transistor are connected with an inversion input node, and gates of said second P-type transistor and said second N-type transistor are connected with a non-inversion input node;
a second constant current source connected between sources of said first and second N-type transistors which are connected in common, and a negative side power supply voltage;
a series connection of a second switch and a second capacitor connected in parallel to said second constant current source;
a cascade connection type first current mirror circuit configured to convert output current signals from said N-type differential pair into a voltage signal;
a cascade connection type second current mirror circuit configured to convert output current signals from said P-type differential pair into a voltage signal;
third and fourth constant current sources connected between said first current mirror circuit and said second current mirror circuit and configured to supply currents as floating current sources;
an output N-type transistor and an output P-type transistor connected in series between said positive side power supply voltage and said negative side power supply voltage;
a first phase compensation capacitor provided between an output node between said output N-type transistor and said output P-type transistor and said first current mirror circuit, and a second phase compensation capacitor provided between said output node and said second current mirror circuit.

9. A liquid crystal driver circuit comprising:
a buffer circuit in which an operational amplifier circuit is connected as a voltage follower; and
a gray-scale voltage generating circuit configured to generate a gray-scale voltage based on an input signal to output to said buffer circuit,
wherein said operational amplifier circuit comprises:
a first differential amplifier section comprising a P-type differential pair of P-type transistors;
a second differential amplifier section comprising an N-type differential pair of N-type transistors;
intermediate stage connected with outputs of said first and second differential amplifier sections and comprising a first current mirror circuit of P-type transistors, and a second current mirror circuit of N-type transistors; and
an output stage configured to amplify a power of an output of said intermediate stage,
wherein said first differential amplifier section comprises a first current source and a first capacitor between sources of said P-type transistors of said P-type differential pair and a positive side power supply voltage, and wherein said second differential amplifier section comprises a second current source and a second capacitor between sources of said N-type transistors of said N-type differential pair and a negative side power supply voltage.

10. A liquid crystal display comprising:

an operational amplifier circuit comprising first and second switches; and a control circuit configured to generate first and second control signals used to control said first and second switches to supply to said operational amplifier circuit, wherein said operational amplifier circuit comprises:

a first differential amplifier section comprising a P-type differential pair of P-type transistors;

a second differential amplifier section comprising an N-type differential pair of N-type transistors;

an intermediate stage connected with outputs of said first and second differential amplifier sections and comprising a first current mirror circuit of P-type transistors, and a second current mirror circuit of N-type transistors; and an output stage configured to amplify a power of an output of said intermediate stage, wherein said first differential amplifier section comprises a first current source and a first capacitor between sources of said P-type transistors of said P-type differential pair and a positive side power supply voltage, wherein said second differential amplifier section comprises a second current source and a second capacitor between sources of said N-type transistors of said N-type differential pair and a negative side power supply voltage, wherein said first switch is provided between the sources of said P-type transistors of said P-type differential pair and said first capacitor, and said second switch is provided between the sources of said N-type transistors of said N-type differential pair and said second capacitor, and wherein said first switch and said second switch are alternately opened or closed in synchronization with an input differential signal supplied to said first differential amplifier and said second differential amplifier.

* * * * *